United States Patent [19]

Pausch

[11] Patent Number: 5,309,107
[45] Date of Patent: May 3, 1994

[54] METHOD FOR CONSTRUCTING A TRANSVERSAL GRADIENT COIL IN A MAGNETIC RESONANCE IMAGING SYSTEM

[75] Inventor: Guenther Pausch, Effeltrich, Fed. Rep. of Germany

[73] Assignee: Siemens Aktiengesellschaft, Munich, Fed. Rep. of Germany

[21] Appl. No.: 14,220

[22] Filed: Feb. 5, 1993

[30] Foreign Application Priority Data

Feb. 7, 1992 [DE] Fed. Rep. of Germany ....... 4203582

[51] Int. Cl.⁵ ............................................. G01R 33/20
[52] U.S. Cl. .................................... 324/318; 324/322
[58] Field of Search ............... 324/300, 307, 309, 310, 324/311, 312, 313, 314, 318, 322, 319; 128/653.5

[56] References Cited

U.S. PATENT DOCUMENTS

| | | | |
|---|---|---|---|
| 4,456,881 | 6/1984 | Compton | 324/319 |
| 4,712,067 | 12/1987 | Roschmann et al. | 324/318 |
| 4,725,781 | 2/1988 | Roschmann | 324/318 |
| 5,212,450 | 5/1993 | Carvajal et al. | 324/322 |
| 5,227,727 | 7/1993 | Makita | 324/322 |

OTHER PUBLICATIONS

"NMR Imaging Techniques and Applications: A Review," Bottomley, Review of Scientific Instrumentation, vol. 53, No. 9 (1982), pp. 1319-1337 (no month).
"Magnetic Field Profiling: Analysis and Correcting Coil Design," Romeo et al. Magnetic Resonance in Medicine, vol. 1 (1984), pp. 44-65 (no month).

*Primary Examiner*—Michael J. Tokar
*Attorney, Agent, or Firm*—Hill, Steadman & Simpson

[57] ABSTRACT

For the purpose of constructing a transversal gradient coil, formed by a conductor, for producing a target field distribution with a prescribed current in a magnetic resonance imaging system, a series of points defining the locations of the coil conductor on a carrier are identified by placing a grid mesh network of elementary saddle coils over the carrier, calculating the magnetic field of these elementary saddle coils and defining a number of ampere-turns for each elementary saddle coil with a fit algorithm on the basis of the target field distribution. The discrete conductor position points are then identified by integration which, in combination, define the path of the coil conductor on the carrier.

8 Claims, 5 Drawing Sheets

Development Coefficients →

$W^T =$ [W(1), W(2), W(3), W(4), W(5), W(6), W(7), W(8), W(9), ..., W(i)]

5,309,107

METHOD FOR CONSTRUCTING A TRANSVERSAL GRADIENT COIL IN A MAGNETIC RESONANCE IMAGING SYSTEM

BACKGROUND OF THE INVENTION

1. Field of the Invention

The present invention is directed to a method for constructing a transversal gradient coil of the type employed in a nuclear magnetic resonance tomography apparatus.

2. Description of the Prior Art

As is known, a topical resolution of the nuclear magnetic resonance signals in a magnetic resonance tomography apparatus ensues by superimposing a magnetic field gradient on a uniform, static basic field on the order of magnitude of 1 T. The principles of such imaging are explained, for example, in the article "NMR Imaging Techniques and Applications: A Review", Bottomley, *Review of Scientific Instrumentation*, Vol. 53, No. 9, September 1982, pages 1319-1337. For obtaining a topical resolution in three dimensions, magnetic field gradients in three directions, preferably disposed perpendicularly relative to each other, must be generated. Conventional arrangements of transversal and axial gradient coils in a magnetic resonance imaging apparatus are shown in FIGS. 1 and 2, wherein a Cartesian coordinate system with axes respectively extending in the x, y, z directions is schematically shown to illustrate the directions of the respective gradients.

The conventional arrangement of transversal gradient coils shown in FIG. 1 is for generating a magnetic field gradient $G_y$ in y-direction. The gradient coils 2 are in the form of saddle coils, which are secured on a carrying cylinder 1. A substantially constant magnetic field gradient $G_y$ is generated in y-direction within a spherical examination volume 11 as a result of the conductor sections 2a. Due to their size and distance from the examination volume, the return conductors generate only slight magnetic field components in the examination volume 11, and these slight contributions are thus usually not considered in the design of the gradient coil.

The gradient coils for the generating the magnetic field gradient $g_x$ in the x-direction are constructed identical to the gradient coils 2 for the $G_y$ magnetic field gradient, but are rotated 90° in azimuthal direction on the carrying cylinder 1. For clarity, the coils for generating the $G_x$ gradient are not shown in FIG. 1.

Axial gradient coils 3 for generating a magnetic field gradient $G_z$ in the z-direction are schematically shown in FIG. 2. The coils 3 are annular and are symmetrically disposed relative to the center of the examination volume 11. Because the two individual coils 3a and 3b have current flowing through them in opposite directions, as indicated in FIG. 2, they generate a magnetic field in the z-direction.

High demands are made on the linearity of the gradient fields in order to avoid image distortions. These high demands cannot be satisfied with the simple, schematically illustrated conductor structures shown in FIGS. 1 and 2. In particular, the transversal gradient coils for respectively generating the $G_x$ and $G_y$ gradients are complex in terms of design, and are the subject of the gradient coil construction method disclosed herein.

There are basically two procedures for designing gradient coils, namely the analytical projection method and the numerical projection method.

The analytical projection method inherently has the problem that the desired, linear field path, in its strictly mathematical form, results in solutions which cannot be technologically achieved, making the introduction of "relaxing" or "forgiving" boundary conditions necessary. Arbitrary error terms are attached to the algorithm with respect to degree, order and amplitude, which generally do not represent an optimum with respect to structures which can be physically or technologically achieved.

The numerical projection technique has the advantage that, on the basis of suitable mathematical organization methods (for example, least squares fit in the simplest case), deviations which are minimized only in their amplitude, but not with respect to the degree and to the order of the disturbance, are derived in addition to the desired field course. Because the projection already takes the physical nature of the arrangement into consideration, a "natural error spectrum" will be derived.

Due to the large parameter space, however, numerical methods are generally limited to simple coil geometries (for example, saddle coils).

A more complex coil geometry is disclosed in U.S. Pat. No. 4,456,881. The coil area is therein is subdivided into a plurality of surface elements. A current density vector is defined in each of these elements such that the current density distribution resulting therefrom generates the desired target field with a maximally permissible error amplitude. Because this method does not take the continuity condition into consideration, the coils calculated in this manner lack respective conductor returns. These are therefore attached to the outermost end of the coil, without taking their influence on the gradient field into consideration. A field error results therefrom, which constitutes a disadvantage of this known method.

SUMMARY OF THE INVENTION

It is an object of the present invention to provide a method for constructing a transversal gradient coil for use in a magnetic resonance imaging apparatus such that the transversal gradient coil generates an optimally linear field, and wherein desired boundary conditions can be taken into account in the coil construction.

The above object is achieved in a method wherein an imaginary grid mesh network is placed over the carrier on which the coil is to be disposed. Each grid opening in the grid mesh is occupied with a modeled elementary saddle coil in the form of a closed turn. The magnetic field which would be generated by each elementary saddle coil, given a prescribed current, is then calculated. A number of ampere-turns for each elementary saddle coil is then defined using a fit algorithm, based on a target field distribution, i.e., if the target field distribution were to be achieved by the combination of the elementary saddle coils, it is determined what number each elementary saddle coil would have to have. Since each mesh branch has contributions from the adjacent elementary saddle coils, a number of ampere-turns for each mesh branch is calculated by superimposing the ampere-turns for all of the elementary saddle coils which are adjacent each mesh branch. The ampere-turn density obtained in this manner is then successively integrated along a path based on the prescribed current which is to be used, to obtain a plurality of points on the carrier. The conductor which is to form the coil is then positioned on the carrier in a configuration conforming to these points.

This method avoids the disadvantages of the initially-discussed methods and enables a numerical calculation, and a coil construction based thereon, of complex coil structures without limitation. By introducing the physical boundary conditions into the construction method, such as eddy currents in the cryoshield, global bending forces, and/or mechanical vibrations, the gradient coils can be constructed so that, in addition to generating an optimized gradient field, they have customized properties. For example, the following properties can be achieved by introducing physical boundary conditions. Active correction of field errors deriving from eddy currents in the cryoshield can be achieved, as can minimization of the eddy currents in the cryoshield. By minimizing global bending forces, noise reduction can be achieved. Optimization of the mechanical vibration behavior of the system can be achieved by minimizing the reaction forces between the fundamental field magnet and the gradient coils.

DESCRIPTION OF THE DRAWINGS

FIG. 3 is a schematic representation of the overlay of a grid mesh network on the coil carrier, which is undertaken in accordance with the principles of the method disclosed herein.

FIG. 4 is a graphical arrangement for explaining the "turn vector" used in the method disclosed herein.

DESCRIPTION OF THE PREFERRED EMBODIMENTS

Figure 1:
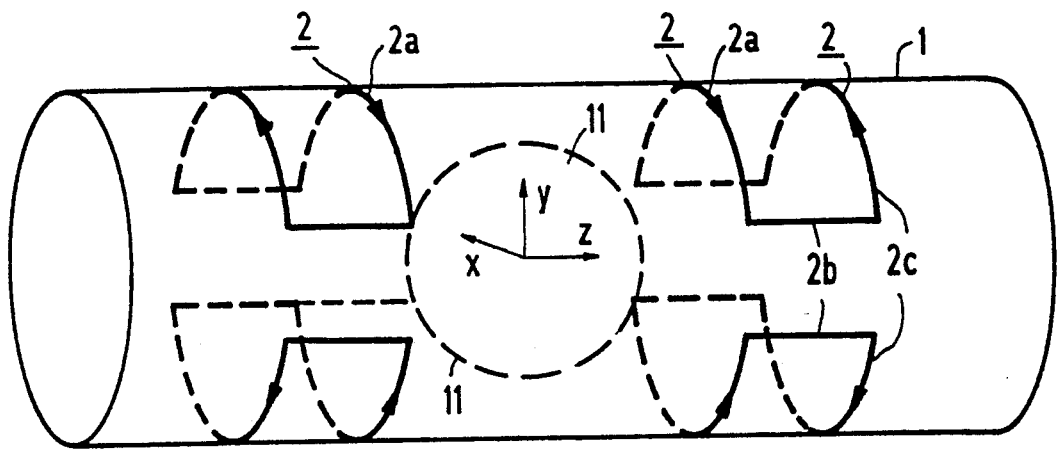
FIG. 1, as noted above, shows a conventional arrangement of transversal coils in a magnetic resonance imaging system.
Figure 2:
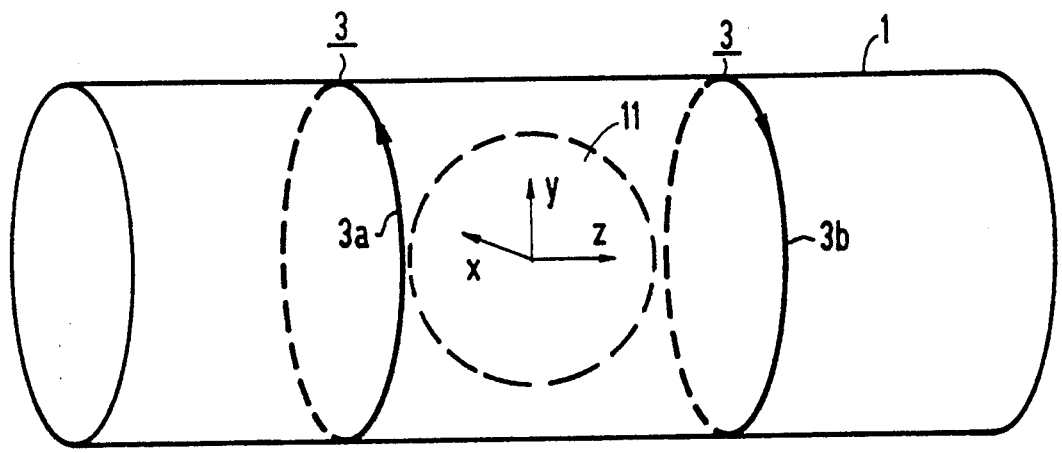
FIG. 2, as noted above, shows a conventional arrangement of axial coils in a magnetic resonance imaging system.
Figures 3, 4:
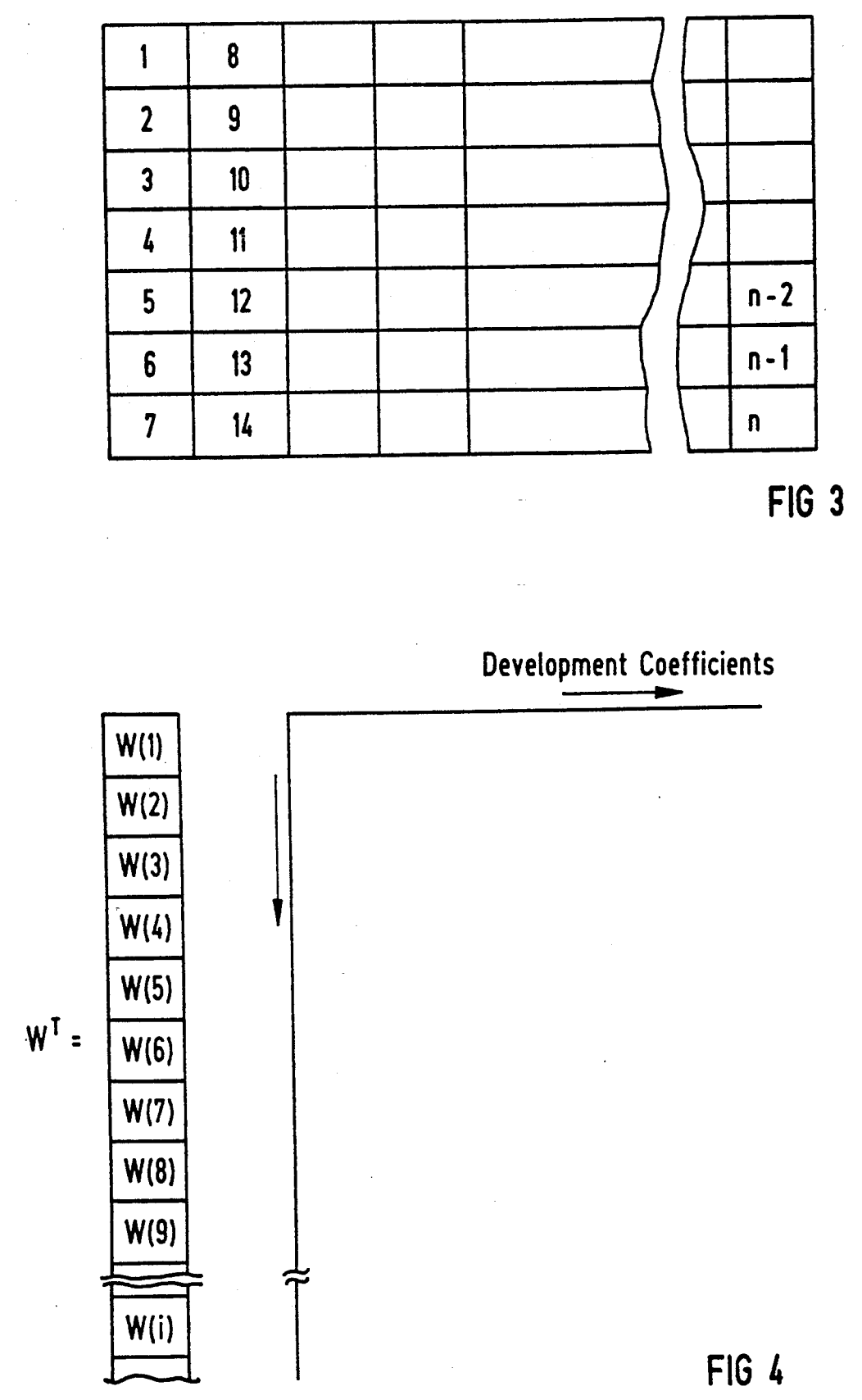

For constructing a coil in accordance with the principles of the present method, the planned coil surface is first divided into a plurality of rectangular elementary areas adjoining one another, so that a grid mesh network arises. This is schematically shown in FIG. 3, wherein the individual elementary areas or grid openings are consecutively numbered 1 through n. Each grid opening is defined by four mesh branches which surround the grid opening. One can imagine each of these grid openings being surrounded by a conductor forming the mesh branches, so that a plurality of "elementary saddle coils" conceptually arises, each composed of one conductor turn.

Subsequently, the effect of each elementary saddle coil, permeated by a prescribed current I, on the magnetic field in the examination area is calculated for this prescribed coil current. There are a number of known methods for calculating these individual magnetic fields; calculation on the basis of spherical functions being the most standard, as described, for example, in the article, "Magnetic Field Profiling: Analysis and Correcting Coil Design," Romeo et al., *Magnetic Resonance in Medicine* Vol. 1, (1984), pages 44–65. In spherical function representation, for example, the field spectrum of the $i^{th}$ elementary saddle coil is represented by $A11(i)$, $A31(i)$, $A51(i)$, $A33(i)$, $A53(i)$ . . . . One generally strives for a linear course for the gradient fields, so that the desired target field has a spectrum designated by $A11=1$, $A31=A51=A33=0$.

The initial goal of the method is to define a number of turns for each elementary saddle coil such that the target field is achieved as precisely as possible. The numbers of turns $W1$ through $Wn$ for the individual elementary saddle coils can be represented in the form of a "turn vector" $W$ as schematically indicated in FIG. 4, wherein $W(i)$ indicates how many turns (including fractions of a turn) are required for the $i^{th}$ elementary saddle coil in order to achieve the target field. A matrix wherein the spherical terms or development coefficients for each individual saddle coil are entered line-by-line is allocated to this turn vector $W$, a "blank" matrix of this type being schematically shown in FIG. 4. A "turn vector" $W$ can then be calculated with a suitable fit algorithm with $W(i)$ indicating how many "turns" (not necessarily whole-numbered) are required for the $i^{th}$ elementary saddle coil in order to achieve the target field.

Those skilled in the art are familiar with several mathematical fit algorithms, such as "least squares," or "linear programming," or "quadratic simplex." Such algorithms can be executed with commercially available software of a type offered by various manufacturers, such as "Harwell Subroutine Library" or the "NAG Library." This latter program library contains more than a dozen different fit algorithms under the title "Minimizing or Maximizing a Function."

The optimization in accordance with the method herein can be formulated in the standard form $w^T \times A = z$, wherein $w^T$ represents the turn vector which is sought, $A$ represents the active matrix of the elementary coil and $z$ represents the target vector.

Figure 5:
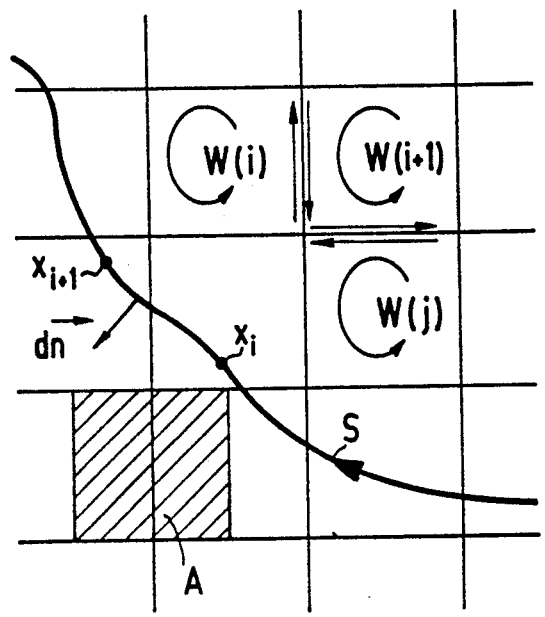
FIG. 5 is a schematic representation showing the superimposition of contributions from adjacent elementary saddle coils in accordance with the principles of the method disclosed herein, and also schematically shows the integration which is undertaken in accordance with the method.

As is shown in FIG. 5, each individual branch of an elementary saddle coil is also a constituent of a neighboring (adjacent) elementary saddle coil. The part of the turn belonging to this branch can therefore be derived by superimposing the adjacent components, taking the operational sign into consideration. When this value is placed in relationship to the entire area corresponding to the branch, a turn/area density is obtained which will generate the prescribed target field and which will also globally satisfy the continuity condition. The continuity condition is satisfied because each individual elementary saddle coil satisfies the continuity condition.

Figure 6:
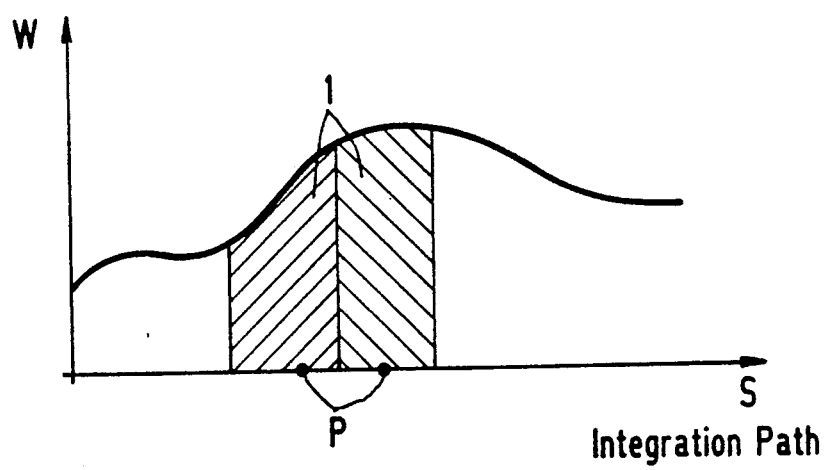
FIG. 6 is a schematic representation of the identification of points obtained in accordance with the method disclosed herein for positioning the coil conductor on the carrier.

The global turn density function thus obtained is thereby defined at the intersections defined by the position of the elementary conductors. Whole-numbered turn numbers are not obtained as a consequence of the mathematics undertaken up to this stage. Given a sufficiently dense arrangement of the elementary saddle coils, however, the position of the turns, in whole-numbers, which is required can be found on the basis of a suitable integration. As schematically shown in FIG. 5, the integration is undertaken along an integration path S, by means of a series of whole-numbered integrals of the turn portion which is orthogonal relative to the integration path. Mathematically expressed, this means that a point $x_{i+1}$ is sought on the integration path S for a given point $x_i$ which satisfies the condition $$\int_{x_i}^{x_{i+1}} \vec{w} \cdot d\vec{n} = 1,$$

wherein $\vec{w}$ is the turn density and $d\vec{n}$ is the normal relative to the integration path S. The center of gravity of the integration function is then determined between the limits prescribed by the whole-numbered integrals, so that a series of supporting or constituent points are obtained, referenced P in FIG. 6. The conductor comprising the coil is then configured to conform to these points.

There is a large degree of freedom in the selection of the integration path S. For practical reasons, integration paths according to the sorting algorithm will be selected in the design and construction of the coil, with the constituent or supporting points associated with each turn of the coil being combined with this algorithm. If, for example, "stream functions" are used, groups of straight lines through the stagnation point will be preferably selected as the integration paths, since the corresponding software is already available for this purpose. One could, however, move along the mesh boundaries, for example, of the elementary coils in the conducting the integration, with the same result ultimately being obtained.

As noted above, the conductor forming the coil will be configured by combining the supporting points associated with each turn of the conductor, and placing the conductor turns along these supporting points.

Figure 7:
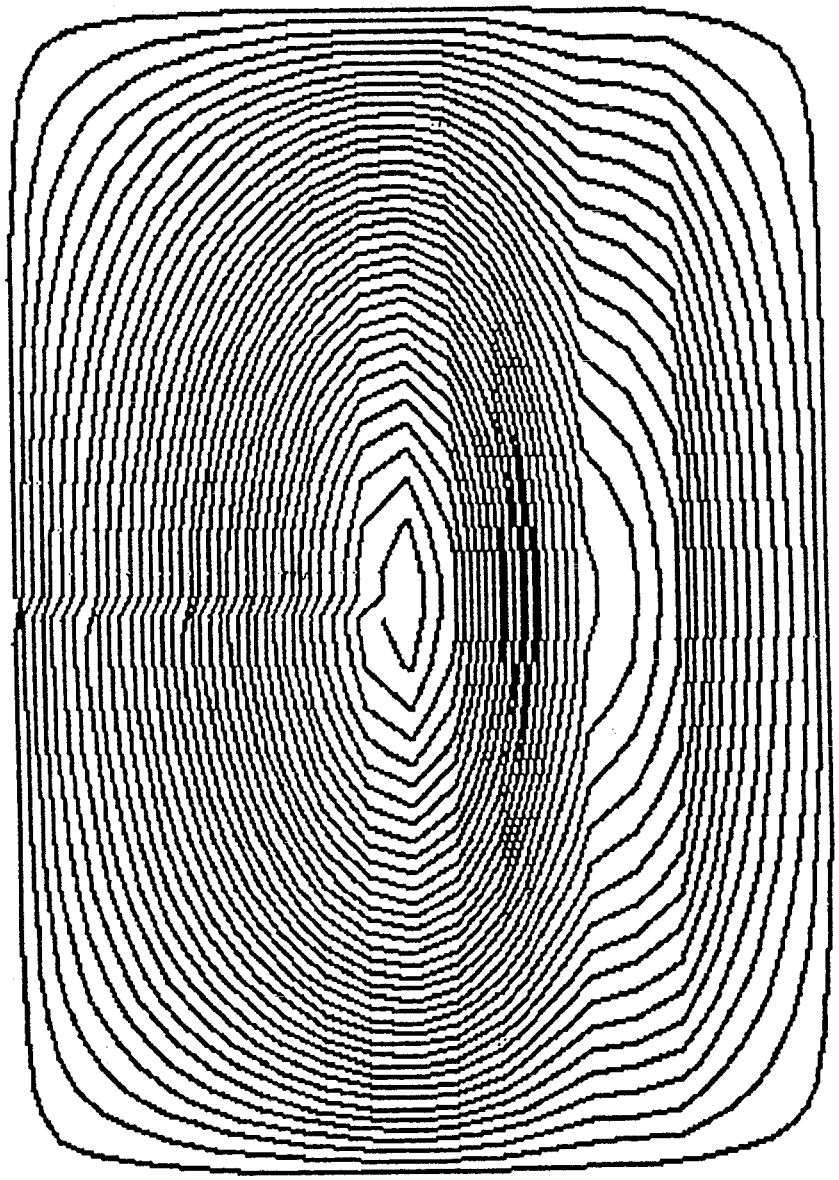
FIGS. 7 and 8 respectively show examples of coils constructed in accordance with the principles of the method disclosed herein.
Figure 8:
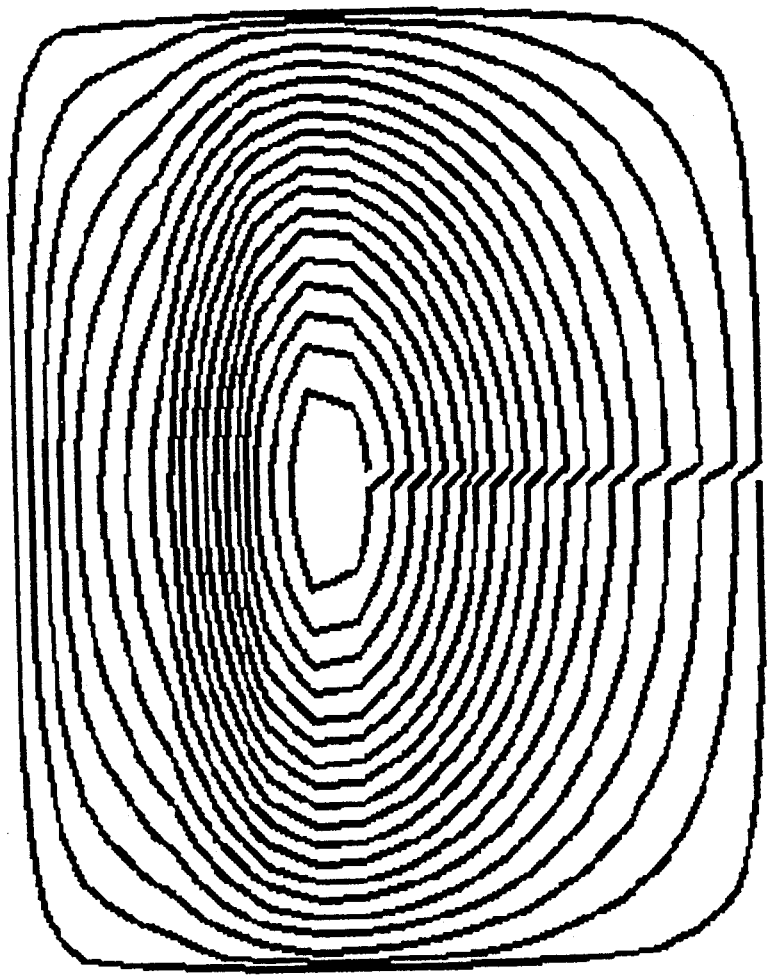

As a consequence of the underlying area elements, the coil configurations produced using the inventive method have corresponding areas of constant current density. The overall current density distribution is formed by the respective discrete contributions of the real conductors, so that a typical pattern of zones of different conductor density, which yield a "stripe" pattern proceeding in azimuthal direction arises. The stripe width corresponds to the width of the area elements. Typical coil configurations obtained according to the inventive method are shown in FIGS. 7 and 8.

A significant advantage of the method disclosed herein is that not only a conventional optimization with regard to a target field can be implemented, but also other properties of the gradient coil can be optimized by the introduction into the method of suitable boundary conditions.

Auxiliary conditions for optimizing other properties of the gradient coil (for example, minimization of the coil inductance) can only be satisfied at the expense of other properties. For example, given an optimized formulation, a better coil linearity will result in a higher coil inductance.

Such demands are generally formulated in the form of a function to be minimized, for example $F = Q + f \times L$. In this case, the function F to be minimized is the sum of a quality function Q and the inductance L, weighted by a weighting factor f. The weighting factor f offers the user the possibility of varying the centers of gravity of this optimization strategy—whether, for example, a good coil quality Q is more important than the coil inductance, or vice versa.

For example, eddy currents in the cryoshield of the magnet caused by the activated gradient fields can be minimized. In the context of the inventive method, in a sufficiently dense grid at the location of the cryoshield, the radial component of the magnetic field generated by each elementary saddle coil is additionally calculated. Analogously, the aforementioned target field vector $A = (A11, A31, A51 ...)$ is expanded by the boundary conditions such that the sum of all radial components becomes minimal at every intersection point of the grid, i.e., $A' = (A11, A31, ..., 0, ... 0, 0)$. The spherical function terms are again referenced A11, etc. The aforementioned weighting factor can then be inserted in the actual minimization routine, which sets the allowable deviation from the target field in relationship to the auxiliary demands. Given a corresponding shaping of the coil surface (for example, a double-shelled cylinder), an entirely or partially actively shielded gradient coil can be derived dependent on the demand.

Moreover, the coil inductance can be minimized on the basis of suitable boundary conditions in accordance with the principles of the present method. This is particularly significant if the gradient coils are to be switched extremely rapidly. In the inventive method, again with a network of elementary saddle coils which is sufficiently dense, the inductance of the gradient coils can be calculated by the overall inductance of all the elementary saddle coils, taking their respective numbers of turns into consideration. To this end, an "inductance matrix" can be additionally calculated, with all self-inductances and all coupling inductances of all saddle coils being contained therein. Various techniques for calculating such an inductance matrix can be found in the literature regarding electrodynamics. Additionally, there are commercially available software packages (for example, MFB3D) which offer such calculating routines. The components of the solution vector W which is sought enter quadratically into the inductance calculation, so that a linear problem remains after differentiation, given a minimization parameterization.

Further, field errors caused by eddy currents in the cryoshield can be corrected in the context of the present method by prescribing suitable boundary conditions. For this purpose, the cylindrical surface of the cryoshield is also imagined as being subdivided into elementary saddle coils. A matrix K is calculated which contains the currents for each elementary saddle coil of the gradient coil induced by flux coupling in all elementary saddle coils of the cryoshield. The flux coupling is defined with a coupling inductance $M_{kl}$ of the gradient coil, and is defined for every elementary coil 1 through n of the cryoshield. It is assumed that this is a quasi-stationary event, which means that, for reasons of energy conservation, the coupling flux $M_{kl} \times L_k$ must equal the flux $m_{11} \times I_1$ generated in the cryoshield mesh by the induced current. When the totality of all mesh currents is calculated, an "eddy current" $I_1$ is obtained for each cryoshield mesh 1 through n, the effect thereof being capable of being calculated in each of the target points, for example using the Bio-Savart law. The matrix K contains precisely this result in the form of a field error $F = K \times L$.

When the target vector A is replaced by the vector A–F, a gradient coil which "precorrects" the eddy current fields (assumed to be quasi-stationary) is obtained in an iterative procedure. Finally, minimization of the reaction forces between the fundamental magnetic field and the gradient fields can be undertaken, so that the noise caused by the gradient coil is reduced. The field component of the gradient coil which contributes most to the Lorentz force is minimized at the location of the fundamental magnetic field coil (or coils) on the basis of a suitable boundary condition for this purpose.

This involves the same optimization principle as described above. In addition to the field effect of each elementary mesh, the interaction force thereof with the fundamental field magnet is also calculated. Because these forces are linear with respect to the elementary coil current, the entire force k can, for example, be calculated as the sum of all individual forces. The function to be minimized is again the function $F = Q + f \times k$. The weighting factor is again referenced f. One proceeds analogously in order to calculate the global bending moment; for each elementary coil, the moment is merely defined with reference to the system origin.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for constructing a transversal gradient coil formed by a conductor for producing a target field distribution with a prescribed current in a magnetic resonance imaging system, said method comprising the steps of:
    subdividing a surface of a carrier on which said coil is to be disposed by means of a grid mesh network placed over said carrier, said network having grid openings and mesh branches;
    occupying each grid opening in said network with a modeled elementary coil in the form of a closed turn, each elementary coil generating a respective magnetic field;
    calculating the magnetic field generated by each of said elementary coils;
    defining a number of ampere-turns for each elementary coil using a fit algorithm based on said target field distribution;
    calculating a number of ampere-turns for each mesh branch by superimposing the ampere-turns for all of the elementary coils elements adjacent each mesh branch and thereby obtaining an ampere-turn density distribution over said network;
    successively integrating said ampere-turn density distribution over whole-numbers of turns along an integration path based on said prescribed current to obtain a plurality of points on said carrier; and
    positioning said conductor on said carrier in a configuration conforming to said points.

2. A method as claimed in claim 1 wherein the step of successively integrating said ampere-turn density distribution is further defined by successively integrating said ampere-turn density distribution over whole-numbers of turns along an integration path based on said prescribed current to obtain a plurality of points on said carrier respectively corresponding to the centers of gravity of said distribution divided into segments defined by said whole-numbers of turns.

3. A method as claimed in claim 2 wherein the step of defining the number of ampere-turns for each elementary saddle coil using a fit algorithm based on said target field distribution is further defined by defining a number of ampere-turns for each elementary coil using a fit algorithm based on said target field distribution and on a selected physical boundary condition for optimizing at least one overall behavior characteristic of said gradient coil.

4. A method as claimed in claim 3 wherein said magnetic resonance imaging system includes a cryoshield, and wherein the step of defining a number of ampere-turns for each elementary coil using a fit algorithm based on said target field distribution and a selected boundary condition is further defined by using a fit algorithm based on said target field distribution and boundary conditions for correcting field errors due to eddy currents in said cryoshield.

5. A method as claimed in claim 3 wherein said magnetic resonance imaging system includes a cryoshield, and wherein the step of defining a number of ampere-turns for each elementary coil using a fit algorithm based on said target field distribution and a selected boundary condition is further defined by using a fit algorithm based on said target field distribution and a boundary condition for minimizing eddy currents in said cryoshield.

6. A method as claimed in claim 3 wherein the step of defining a number of ampere-turns for each elementary coil using a fit algorithm based on said target field distribution and a selected boundary condition is further defined by using a fit algorithm based on said target field distribution and a boundary condition for minimizing global bending forces.

7. A method as claimed in claim 3 wherein the step of defining a number of ampere-turns for each elementary coil using a fit algorithm based on said target field distribution and a selected boundary condition is further defined by using a fit algorithm based on said target field distribution and a boundary condition for minimizing mechanical vibration behavior in said magnetic resonance imaging system.

8. A method as claimed in claim 1 wherein the step of occupying each grid opening in said network with a modeled elementary coil in the form of a closed turn is further defined by occupying each grid opening in said network with a modeled elementary saddle coil in the form of a closed turn.

* * * * *